(12) United States Patent
Tseng et al.

(10) Patent No.: US 11,689,188 B2
(45) Date of Patent: Jun. 27, 2023

(54) SIGNAL OUTPUT CIRCUIT AND METHOD

(71) Applicant: REALTEK SEMICONDUCTOR CORPORATION, Hsinchu (TW)

(72) Inventors: Kuan-Hao Tseng, Hsinchu (TW); Ka-Un Chan, Hsinchu (TW); Po-Chih Wang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 273 days.

(21) Appl. No.: 17/244,073

(22) Filed: Apr. 29, 2021

(65) Prior Publication Data
US 2021/0351764 A1    Nov. 11, 2021

(30) Foreign Application Priority Data

May 5, 2020   (TW) ................................ 109114901

(51) Int. Cl.
*H03K 5/1252* (2006.01)
*H04B 1/04* (2006.01)
*H03H 11/12* (2006.01)

(52) U.S. Cl.
CPC ........... *H03H 11/12* (2013.01); *H03K 5/1252* (2013.01); *H04B 1/0475* (2013.01)

(58) Field of Classification Search
CPC ................ H03K 5/1252; H04B 1/0475; H04B 2001/0408
See application file for complete search history.

(56) References Cited

U.S. PATENT DOCUMENTS

| 5,966,684 A | 10/1999 | Richardson et al. | |
|---|---|---|---|
| 2021/0135657 A1* | 5/2021 | Tsutsui | H03F 3/21 |
| 2021/0203289 A1* | 7/2021 | Honda | H03F 3/26 |

OTHER PUBLICATIONS

IEEE paper:"A Highly Linear and Efficient Differential CMOS Power Amplifier With Harmonic Control", IEEE Journal of Solid-State circuits, vol. 41, No. 6, Jun. 2006.
(Continued)

*Primary Examiner* — Patrick O Neill
(74) *Attorney, Agent, or Firm* — WPAT, P.C

(57) ABSTRACT

The present invention discloses a signal output circuit having anti-interference mechanism. An amplifier is electrically coupled to a power supply and a ground terminal through a first and a second amplifier bond wires, and generates an amplified output signal. A transformer circuit includes a transformer performing impedance transformation on the amplified output signal to generate a transformed output signal and a voltage-stabilizing capacitor suppressing second-order harmonics of the amplifier. A power-terminal side anti-interference circuit includes a power-terminal side bond wire and a power-terminal side anti-interference capacitor. The power-terminal side bond wire is electrically coupled to the ground terminal. The power-terminal side anti-interference capacitor is electrically coupled between the power-terminal side bond wire and the first amplifier bond wire, to cooperate with the power-terminal side bond wire, to filter out a first-order harmonics coupling signal coupled to the first amplifier bond wire by the transformed output signal generated by the transformer circuit.

16 Claims, 3 Drawing Sheets

(56) References Cited

OTHER PUBLICATIONS

OA letter of the counterpart TW application (appl. No. 109114901) mailed on Jan. 5, 2021. Summary of the OA letter: 1. Claim 1 includes a term lack of antecedent basis and required modification. Tha claim that claim 6 depends on should be claim 1 and is required to be modified 2. Claims 1-3 and 8-9 are rejected as being unpatentable over the disclosure of the cited reference 1 (U.S. Pat. No. 5,966,684). 3. Claims 4, 5, 7 and 10 are allowed.

* cited by examiner

SIGNAL OUTPUT CIRCUIT AND METHOD

BACKGROUND OF THE INVENTION

1. Field of the Invention

The present invention relates to a signal output circuit and a signal output method.

2. Description of Related Art

In chip designing, a signal output circuit that includes an amplifier and a transformer requires impedance matching and amplification on a signal for outputting the signal. However, in a chip package, the wires of the power and the output signal may be in proximity or disposed on the same side of the chip. The signal on the signal output path of the amplifier may generate a noise that results in interference on the power due to the electrical coupling of the bond wires.

Due to the noise described above that is transmitted through a shared power wire from a voltage-stabilizing capacitor of a voltage feed-in spot of the transformer to the ground terminal of the amplifier, an additional second-order harmonics may be generated.

SUMMARY OF THE INVENTION

In consideration of the problem of the prior art, an object of the present invention is to supply a signal output circuit and a signal output method.

The present invention discloses a signal output circuit having anti-interference mechanism that includes an amplifier, a transformer circuit and a power-terminal side anti-interference circuit. The amplifier is electrically coupled to a power supply through a first amplifier bond wire and to a ground terminal through a second amplifier bond wire, and configured to operate according to the power supply and generate an amplified output signal. The transformer circuit includes a transformer and a voltage-stabilizing capacitor. The transformer is configured to perform impedance transformation on the amplified output signal to generate a transformed output signal. The voltage-stabilizing capacitor is configured to suppress second-order harmonics of the amplifier. The power-terminal side anti-interference circuit includes a power-terminal side bond wire and a power-terminal side anti-interference capacitor. The power-terminal side bond wire is electrically coupled to the ground terminal. The power-terminal side anti-interference capacitor is electrically coupled between the power-terminal side bond wire and the first amplifier bond wire, to operate together with the power-terminal side bond wire, so as to filter out a first-order harmonics coupling signal coupled to the first amplifier bond wire by the transformed output signal generated by the transformer circuit.

The present invention also discloses a signal output method having anti-interference mechanism used in a signal output circuit that includes the steps outlined below. An amplifier is operated according to a power supply and is configured to generate an amplified output signal by the amplifier, wherein the amplifier is electrically coupled to the power supply through a first amplifier bond wire and to a ground terminal through a second amplifier bond wire. Impedance transformation is performed on the amplified output signal by a transformer comprised in a transformer circuit to generate a transformed output signal, and second-order harmonics of the amplifier is suppressed by a voltage-stabilizing capacitor comprised in the transformer circuit. A power-terminal side bond wire comprised by a power-terminal side anti-interference circuit is operated together with a power-terminal side anti-interference capacitor comprised by the power-terminal side anti-interference circuit, so as to filter out a first-order harmonics coupling signal coupled to the first amplifier bond wire by the transformed output signal generated by the transformer circuit, wherein the power-terminal side bond wire is electrically coupled to the ground terminal and the power-terminal side anti-interference circuit is electrically coupled between the power-terminal side bond wire and the first amplifier bond wire.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a signal output circuit and a signal output method having anti-interference mechanism to directly filter out the coupling signal having the first-order harmonics by using an anti-interference circuit having a smaller circuit area to increase the efficiency of anti-interference.

Figure 1:
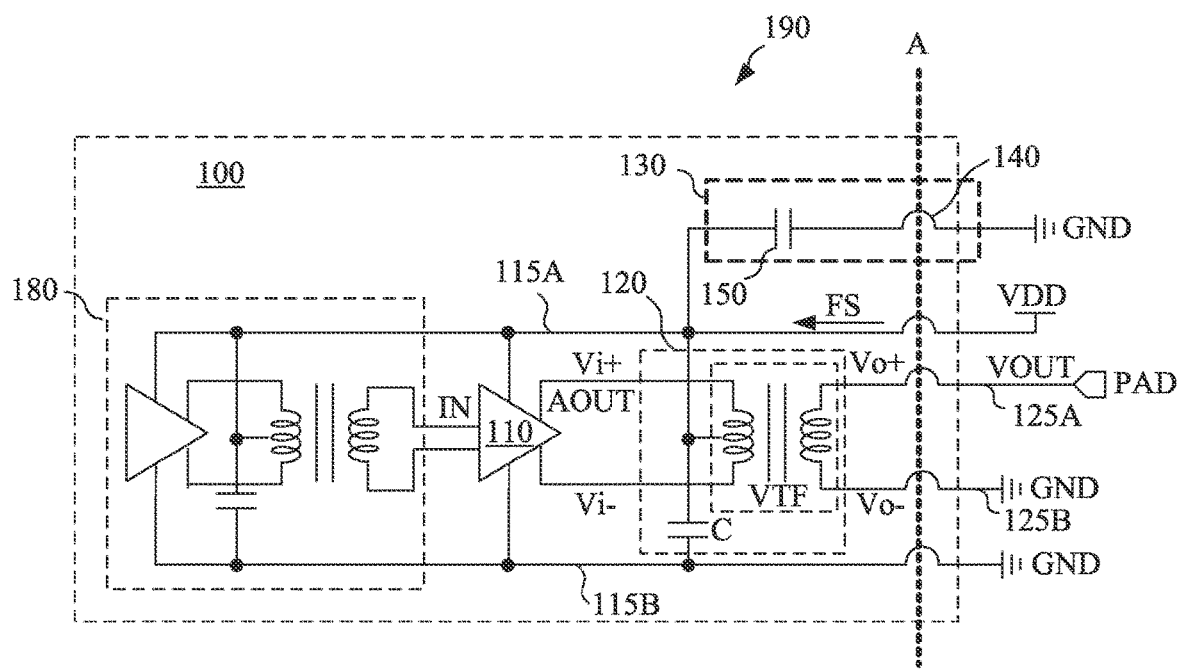
FIG. 1 illustrates a circuit diagram of a signal output circuit having anti-interference mechanism according to an embodiment of the present invention.

Reference is now made to FIG. 1. FIG. 1 illustrates a circuit diagram of a signal output circuit 100 having anti-interference mechanism according to an embodiment of the present invention. In an embodiment, the signal output circuit 100 is disposed in a chip (not illustrated) inside a package structure 170. In FIG. 1, a dashed line A is used to distinguish different sides of the package structure 170. The side of the dashed line A that has the signal output circuit 100 is an internal side of the package structure 170. Another side of the dashed line A is an external side of the package structure 170.

The signal output circuit 100 includes an amplifier 110, a transformer circuit 120 and a power-terminal side anti-interference circuit 130.

The amplifier 110 is electrically connected to a power supply VDD through a first amplifier bond wire 115A and is electrically connected to a ground terminal GND through a second amplifier bond wire 115B. The first amplifier bond wire 115A and the second amplifier bond wire 115B stretch from the internal side to the external side of the package structure 170 such that the amplifier 110 can be electrically connected to the power supply VDD and the ground terminal GND located at the external side of the package structure 170.

The amplifier 110 is configured to operate according to the power supply VDD and generate an amplified output signal AOUT. In an embodiment, the amplifier 110 is electrically connected to an input circuit 180 so as to receive an input signal IN from the input circuit 180, amplify the input signal IN and generate the amplified output signal AOUT.

The transformer circuit 120 includes a transformer VTF and a voltage-stabilizing capacitor C. The transformer VTF is configured to perform impedance transformation on the amplified output signal AOUT to generate a transformed output signal VOUT. The voltage-stabilizing capacitor C is configured to suppress second-order harmonics of the amplifier 110. In an embodiment, the transformer VTF includes input terminals Vi+ and Vi−, an output signal terminal Vo+ and an output ground terminal Vo−.

The input terminals Vi+ and Vi− are configured to receive the amplified output signal AOUT of the amplifier 110. The output signal terminal Vo+ is electrically connected to the output pad PAD through the first transformer circuit bond wire 125A so as to output the transformed output signal VOUT to the output pad PAD through the first transformer circuit bond wire 125A. The output ground terminal Vo− is electrically connected to the ground terminal GND through the second transformer circuit bond wire 125B.

The first transformer circuit bond wire 125A and the second transformer circuit bond wire 125B stretch from the internal side to the external side of the package structure 170 such that the transformer VTF can be electrically connected to the output pad PAD and the ground terminal GND located at the external side of the package structure 170.

When the first amplifier bond wire 115A and the first transformer circuit bond wire 125A are disposed closely, the transformed output signal VOUT generated due to the operation of the transformer VTF is easy to be coupled to the first amplifier bond wire 115A through the first transformer circuit bond wire 125A, to generate a first-order harmonics coupling signal FS. The first-order harmonics coupling signal FS has first-order harmonics (fundamental harmonic) that result in interference on the power signal received by the first amplifier bond wire 115A from the power supply VDD. As a result, the power-terminal side anti-interference circuit 130 provides an anti-interference mechanism to eliminate the effect of the first-order harmonics coupling signal FS.

The power-terminal side anti-interference circuit 130 includes a power-terminal side bond wire 140 and a power-terminal side anti-interference capacitor 150.

The power-terminal side bond wire 140 is electrically connected to the ground terminal GND. The power-terminal side anti-interference capacitor 150 is electrically connected between the power-terminal side bond wire 140 and the first amplifier bond wire 115A. The power-terminal side bond wire 140 stretches from the internal side to the external side of the package structure 170 such that the power-terminal side anti-interference capacitor 150 can be electrically connected to the ground terminal GND located at the external side of the package structure 170.

In an embodiment, power-terminal side bond wire 140 operates as an inductor. As a result, the power-terminal side bond wire 140 operates together with the power-terminal side anti-interference capacitor 150 as a self-resonate circuit to filter out the first-order harmonics coupling signal FS to eliminate the interference on the power signal received by the first amplifier bond wire 115A from the power supply VDD. In an embodiment, the inductance of the power-terminal side bond wire 140 is L and the capacitance of the power-terminal side anti-interference capacitor 150 is C. The LC resonant frequency f0 of the power-terminal side bond wire 140 and the power-terminal side anti-interference capacitor 150 can be expressed as:

$$f0=1/(2\pi \times \mathrm{sqrt}(L \times C))$$

In an embodiment, the LC resonant frequency f0 of the power-terminal side bond wire 140 and the power-terminal side anti-interference capacitor 150 equals to the frequency of the first-order harmonics coupling signal FS, so as to efficiently filter out the first-order harmonics coupling signal FS.

Figure 2:
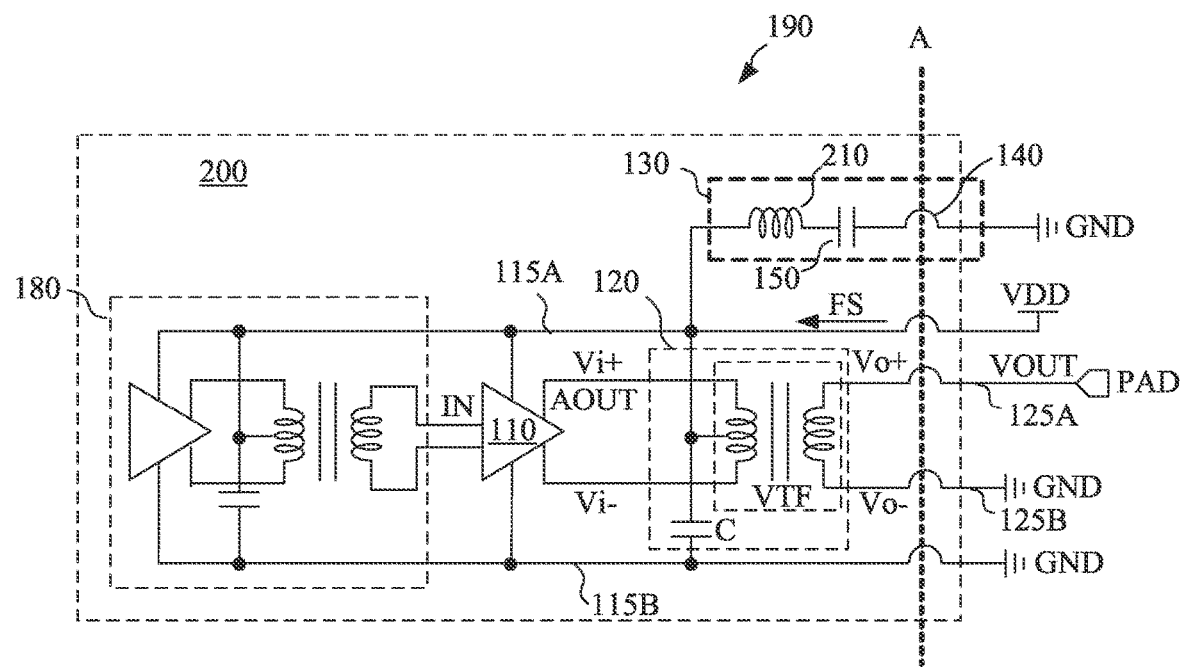
FIG. 2 illustrates a circuit diagram of a signal output circuit having anti-interference mechanism according to an embodiment of the present invention.

Reference is now made to FIG. 2. FIG. 2 illustrates a circuit diagram of a signal output circuit 200 having anti-interference mechanism according to an embodiment of the present invention. Identical to the signal output circuit 100 in FIG. 1, the signal output circuit 200 in FIG. 2 includes an amplifier 110, a transformer circuit 120 and a power-terminal side anti-interference circuit 130. The configuration and the connection relation of the amplifier 110 and transformer circuit 120 are identical to those in FIG. 1. The detail thereof is not described herein.

In the present embodiment, besides the power-terminal side bond wire 140 and the power-terminal side anti-interference capacitor 150, the power-terminal side anti-interference circuit 130 further includes a power-terminal side anti-interference inductor 210. The power-terminal side anti-interference inductor 210 operates together with the power-terminal side bond wire 140 and the power-terminal side anti-interference capacitor 150 as a LC circuit to increase the flexibility of circuit design.

Further, in an embodiment, the LC resonant frequency of the LC circuit that includes the power-terminal side bond wire 140, the power-terminal side anti-interference capacitor 150 and the power-terminal side anti-interference inductor 210 equals to the frequency of the first-order harmonics coupling signal FS under a proper design of the inductance and the capacitance thereof, so as to efficiently filter out the first-order harmonics coupling signal FS.

Figure 3:
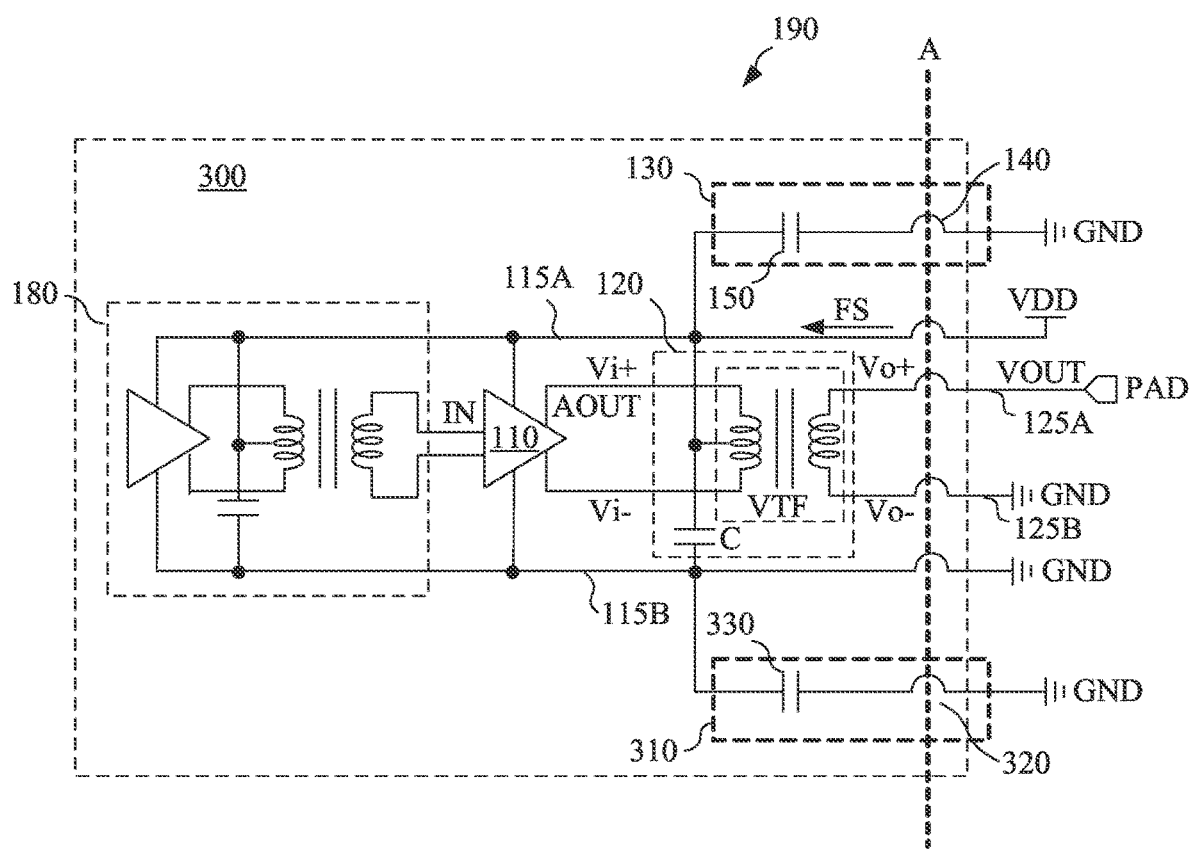
FIG. 3 illustrates a circuit diagram of a signal output circuit having anti-interference mechanism according to an embodiment of the present invention.

Reference is now made to FIG. 3. FIG. 3 illustrates a circuit diagram of a signal output circuit 300 having anti-interference mechanism according to an embodiment of the present invention. Identical to the signal output circuit 100 in FIG. 1, the signal output circuit 300 in FIG. 3 includes an amplifier 110, a transformer circuit 120 and a power-terminal side anti-interference circuit 130. The configuration and the connection relation of the amplifier 110 and transformer circuit 120 are identical to those in FIG. 1. The detail thereof is not described herein.

In the present embodiment, the signal output circuit 300 further includes a ground terminal anti-interference circuit 310. The ground terminal anti-interference circuit 310 includes a ground-terminal side bond wire 320 and a ground-terminal side anti-interference capacitor 330.

The ground-terminal side bond wire 320 is electrically connected to the ground terminal GND. The ground-terminal side anti-interference capacitor 330 is electrically connected to the ground-terminal side bond wire 320 and the second amplifier bond wire 115B. The ground-terminal side bond wire 320 stretches from the internal side to the external side of the package structure 170 such that the ground-terminal side anti-interference capacitor 330 can be electrically connected to the ground terminal GND located at the external side of the package structure 170.

As a result, the ground terminal anti-interference circuit 310 can form a LC circuit identical to the power-terminal side anti-interference circuit 130, to filter output the signal coupled to the second amplifier bond wire 115B by the transformer circuit 120, such as but not limited to a signal having first-order harmonics and second-order harmonics. Further, a ground terminal anti-interference inductor (not illustrated) can be additionally disposed in the ground terminal anti-interference circuit 310 to form the LC circuit together with the ground-terminal side bond wire 320 and the second amplifier bond wire 115B to accomplish the anti-interference mechanism.

In some approaches, the signal output circuit having the amplifier and the transformer circuit uses the filtering circuit that is not able to efficiently filter out the signal due to the location of the filtering circuit or the frequency that the filtering circuit can perform filtering. Second-order harmonics may thus be generated and the amplification efficiency of the amplifier may be affected.

The signal output circuit of the present invention directly filters out the first-order harmonics coupling signal to greatly increase the anti-interference efficiency, and avoids the generation of the second-order harmonics due to the coupling of the first-order harmonics coupling signal to the front-end input circuit through the power wire. Further, by using the bond wire and the capacitor to form the LC circuit, only a smaller circuit area is required to accomplish the anti-interference mechanism.

Figure 4:
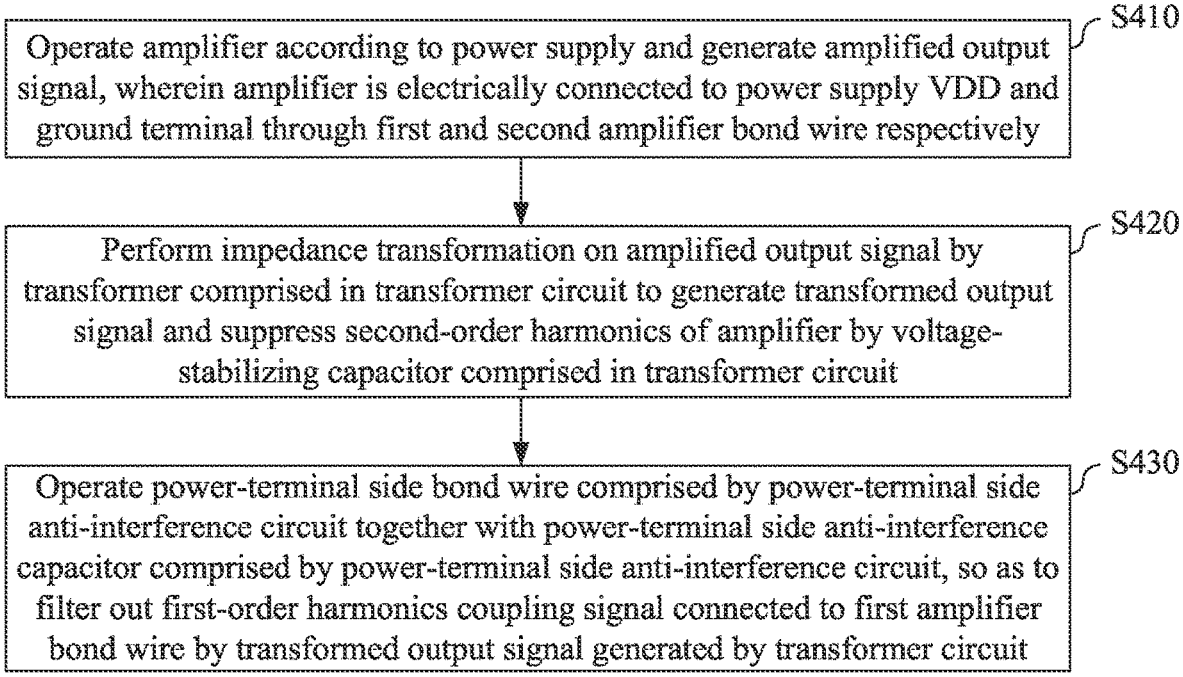
FIG. 4 illustrates a flow chart of a signal output method having anti-interference mechanism according to an embodiment of the present invention.

Reference is now made to FIG. 4. FIG. 4 illustrates a flow chart of a signal output method 400 having anti-interference mechanism according to an embodiment of the present invention.

In addition to the apparatus described above, the present disclosure further provides the signal output method 400 that can be used in such as, but not limited to, the signal output circuit 100 in FIG. 1. As illustrated in FIG. 4, an embodiment of the signal output method 400 includes the following steps.

In step S410, the amplifier 110 is operated according to the power supply VDD and is configured to generate the amplified output signal AOUT. The amplifier 110 is electrically connected to the power supply VDD through the first amplifier bond wire 115A and to the ground terminal GND through the second amplifier bond wire 115B.

In step S420, the impedance transformation is performed on the amplified output signal AOUT by the transformer VTF comprised in the transformer circuit 120 to generate the transformed output signal VOUT, and second-order harmonics of the amplifier 110 is suppressed by the voltage-stabilizing capacitor C comprised in the transformer circuit 120.

In step S430, the power-terminal side bond wire 140 comprised by the power-terminal side anti-interference circuit 130 is operated together with the power-terminal side anti-interference capacitor 150 comprised by the power-terminal side anti-interference circuit 130, so as to filter out the first-order harmonics coupling signal FS coupled to the first amplifier bond wire 115A by the transformed output signal VOUT generated by the transformer circuit 120. The power-terminal side bond wire 140 is electrically connected to the ground terminal GND and the power-terminal side anti-interference circuit 150 is electrically connected between the power-terminal side bond wire 140 and the first amplifier bond wire 115A.

In summary, the signal output circuit and the signal output method of the present invention can directly filter out the first-order harmonics coupling signal by using an anti-interference circuit having a smaller circuit area to greatly increase the anti-interference efficiency.

It is appreciated that the embodiments described above are merely an example. In other embodiments, it should be appreciated that many modifications and changes may be made by those of ordinary skill in the art without departing from the spirit of the disclosure.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A circuit having anti-interference mechanism, comprising:
    an amplifier electrically coupled to a power supply through a first amplifier bond wire and to a ground terminal through a second amplifier bond wire, and configured to operate according to the power supply and generate an amplified output signal;
    a transformer circuit comprising a transformer configured to perform impedance transformation on the amplified output signal to generate a transformed output signal, and a voltage-stabilizing capacitor configured to suppress second-order harmonics of the amplifier; and
    a power-terminal side anti-interference circuit comprising:
        a power-terminal side bond wire electrically coupled to the ground terminal; and
        a power-terminal side anti-interference capacitor electrically coupled between the power-terminal side bond wire and the first amplifier bond wire, to operate together with the power-terminal side bond wire, so as to filter out a first-order harmonics coupling signal coupled to the first amplifier bond wire by the transformed output signal generated by the transformer circuit.

2. The circuit of claim 1, wherein the power-terminal side bond wire operates as an inductor, so as to operate together with the power-terminal side anti-interference capacitor as a LC circuit (inductor-capacitor circuit).

3. The circuit of claim 1, wherein the power-terminal side anti-interference circuit further comprises a power-terminal side anti-interference inductor configured to operate together with the power-terminal side bond wire and the power-terminal side anti-interference capacitor as a LC circuit.

4. The circuit of claim 1, wherein the power-terminal side anti-interference circuit has a LC resonant frequency equal to a frequency of the first-order harmonics.

5. The circuit of claim 1, further comprising a ground terminal anti-interference circuit comprising:
    a ground-terminal side bond wire electrically coupled to the ground terminal; and
    a ground-terminal side anti-interference capacitor configured to electrically coupled between the ground-terminal side bond wire and the second amplifier bond wire.

6. The circuit of claim 5, wherein the ground terminal anti-interference circuit further comprises a ground terminal anti-interference inductor configured to operate together with the ground-terminal side bond wire and the ground-terminal side anti-interference capacitor as a LC circuit.

7. The circuit of claim 1, wherein the transformer comprises:
    a pair of input terminals configured to receive the amplified output signal of the amplifier;
    an output signal terminal electrically coupled to an output pad through a first transformer circuit bond wire, so as to output the first transformer circuit bond wire to the output pad through the first transformer circuit bond wire; and an output ground terminal electrically coupled to the ground terminal through a second transformer circuit bond wire.

8. The circuit of claim 1, wherein the amplifier receives an input signal from an input circuit to amplify the input signal to generate the amplified output signal.

9. A method having anti-interference mechanism, comprising:

operating an amplifier according to a power supply and generating an amplified output signal by the amplifier, wherein the amplifier is electrically coupled to the power supply through a first amplifier bond wire and to a ground terminal through a second amplifier bond wire;

performing impedance transformation on the amplified output signal by a transformer comprised in a transformer circuit to generate a transformed output signal, and suppressing second-order harmonics of the amplifier by a voltage-stabilizing capacitor comprised in the transformer circuit;

operating a power-terminal side bond wire comprised by a power-terminal side anti-interference circuit together with a power-terminal side anti-interference capacitor comprised by the power-terminal side anti-interference circuit, so as to filter out a first-order harmonics coupling signal coupled to the first amplifier bond wire by the transformed output signal generated by the transformer circuit, wherein the power-terminal side bond wire is electrically coupled to the ground terminal and the power-terminal side anti-interference circuit is electrically coupled between the power-terminal side bond wire and the first amplifier bond wire.

10. The method of claim 9, wherein the power-terminal side bond wire operates as an inductor, and the method further comprises:

operating the power-terminal side bond wire together with the power-terminal side anti-interference capacitor as a LC circuit.

11. The method of claim 9, wherein the power-terminal side anti-interference circuit further comprises a power-terminal side anti-interference inductor, and the method further comprises:

operating the power-terminal side anti-interference inductor together with the power-terminal side bond wire and the power-terminal side anti-interference capacitor as a LC circuit.

12. The method of claim 9, wherein the power-terminal side anti-interference circuit has a LC resonant frequency equal to a frequency of the first-order harmonics.

13. The method of claim 9, wherein the signal output circuit further comprises a ground terminal anti-interference circuit that comprises a ground-terminal side bond wire electrically coupled to the ground terminal and a ground-terminal side anti-interference capacitor configured to electrically coupled between the ground-terminal side bond wire and the second amplifier bond wire.

14. The method of claim 13, wherein the ground terminal anti-interference circuit further comprises a ground terminal anti-interference inductor, and the method further comprises:

operating the ground terminal anti-interference inductor together with the ground-terminal side bond wire and the ground-terminal side anti-interference capacitor as a LC circuit.

15. The method of claim 9, wherein the transformer comprises:

a pair of input terminals configured to receive the amplified output signal of the amplifier;

an output signal terminal electrically coupled to an output pad through a first transformer circuit bond wire, so as to output the first transformer circuit bond wire to the output pad through the first transformer circuit bond wire; and an output ground terminal electrically coupled to the ground terminal through a second transformer circuit bond wire.

16. The method of claim 9, further comprising:

receiving an input signal from an input circuit to amplify the input signal by the amplifier to generate the amplified output signal.

* * * * *